United States Patent [19]

Moslehi et al.

[11] Patent Number: 4,913,929

[45] Date of Patent: Apr. 3, 1990

[54] THERMAL/MICROWAVE REMOTE PLASMA MULTIPROCESSING REACTOR AND METHOD OF USE

[75] Inventors: Mehrdad M. Moslehi, Palo Alto; Krishna C. Saraswat, Santa Clara County, both of Calif.

[73] Assignee: The Board of Trustees of the Leland Stanford Junior University, Stanford, Calif.

[21] Appl. No.: 40,909

[22] Filed: Apr. 21, 1987

[51] Int. Cl.⁴ .............................................. C23C 16/00
[52] U.S. Cl. ................................... 427/39; 427/248.1; 427/255.2; 427/255.3; 427/255.4; 118/715; 118/723; 118/725
[58] Field of Search ...................... 118/715, 723, 725; 427/39, 248.1, 255.2, 255.3, 255.4

[56] References Cited

U.S. PATENT DOCUMENTS 4,401,054  8/1983  Matsuo ................................ 118/723

FOREIGN PATENT DOCUMENTS 60-245217 12/1985 Japan .

Primary Examiner—Richard Bueker
Attorney, Agent, or Firm—Flehr, Hohbach, Test, Albritton & Herbert

[57] ABSTRACT

A novel cold wall single wafer rapid thermal/microwave remote plasma multiprocessing reactor comprising a vacuum chamber having means for mounting a wafer in the chamber, means for providing optical flux mounted adjacent one wall facing the back side of the wafer for optical heating of the wafer, and ports for plasma injection such that remote plasma can be generated and pumped into the chamber. Ports are provided for gas injection both through the plasma generating chamber and for non-plasma injection. The plasma and non-plasma ports are connected through separate manifolds to a plurality of gas sources. The comprehensive reactor design is such that several wafer processing steps can be done sequentially in situ, while providing for optimization of each processing step.

14 Claims, 4 Drawing Sheets

| TUNGSTEN DEPOSITION PROCESSES ||||| 
|---|---|---|---|---|
| Deposition Type | Gases through the Quartz Tube | Gases through the Side Ports | Microwave Power | Deposition Condition |
| A | None | $WF_6 + Ar$ | OFF | Selective |
| B | None | $WF_6 + H_2$ | OFF | Selective |
| C | Ar | $WF_6 + H_2$ | OFF | Selective |
| D | $SiF_4$ | $WF_6 + H_2$ | OFF | Selective |
| E | $H_2$ | $WF_6$ | OFF | Selective |
| F | $H_2$ | $WF_6$ | ON | Nonselective |
| G | $Ar + H_2$ | $WF_6$ | ON | Nonselective |
| H | Ar | $WF_6 + H_2$ | ON | Nonselective |
| I | $WF_6 + Ar$ | $H_2$ | ON | Nonselective |
| J | $N_2 + H_2$ | $WF_6$ | ON | Nonselective |
| K | $NH_3 + H_2$ | $WF_6$ | ON | Nonselective |
| L | $NH_3 + H_2$ | $WF_6$ | OFF | Nonselective |

Fig. 5

THERMAL/MICROWAVE REMOTE PLASMA MULTIPROCESSING REACTOR AND METHOD OF USE

This invention was made with United States Government support under Agreement No. MDA903-84-K-0062, awarded by DARPA. The Government has certain rights in this invention.

CROSS REFERENCE TO RELATED APPLICATION

This invention is related to and incorporates by reference the disclosure in U.S. application Ser. No. 859,943 filed May 5, 1986, now U.S. Pat. No. 4,718,937, assigned to the Assignee of this invention, and which discloses a process for remote plasma generation, which process is incorporated into this invention.

BACKGROUND OF THE INVENTION

Future technological advancements in integrated electronics will require development of flexible custom fabrication technology for custom VLSI systems. Present semiconductor wafer processing is based on batch processing technology, i.e., the processing of a plurality of wafers in a given furnace through a single process step, after which the wafers are moved to a different furnace which is dedicated to a different process step.

Low temperatures and short processing times are essential requirements of future VLSI processing. This is especially true with the tremendous growth in the business of producing application specific integrated circuits (ASIC) which by definition are produced in limited quantities, and on which the customer demands rapid turn-around. Reproducible growth of the thin film dielectrics necessary to VLSI devices is difficult in the hot wall furnaces commonly used today due to the long ambient and temperature transient times and constant furnace temperatures. A further difficulty with known furnaces is that it is highly desirable to be able to continuously monitor wafer processing; however, since most standard furnaces are designed to be efficient only for multiwafer processing, extensive in situ real time measurements are difficult to perform.

A related problem in the semiconductor wafer processing field is the need to develop a reliable process for in situ fabrication of tungsten gate MOS devices. The fabrication of such devices requires the growth of a gate dielectric by rapid thermal oxidation (RTO) and rapid thermal nitridation (RTN) cycles followed by a nonselective tungsten deposition to form the gate electrode. Rapid thermal oxidation and nitridation (RTO and RTN) of silicon in oxygen and ammonia ambients has already been recognized as an attractive technique for the growth of silicon nitride, silicon dioxide, nitrided oxides, oxidized nitrides, and application specific (custom tailored) insulators. Tungsten is known to be quite attractive as an MOS gate material, as disclosed by S. Iwata, et al., "A New Tungsten Gate Process for VLSI Application," *IEEE Transactions on Electron Devices.* Vol. ED-31, No. 9, pp. 1174-1179, 1984. However, a reliable process for in situ formation of tungsten gate electrodes has not been developed. Recently, blanket tungsten films were reported to be deposited on silicon dioxide $SiO_2$ films at substrate temperatures below 450° C. by photo enhanced and microwave plasma enhanced hydrogen plasma chemical vapor deposition (CVD) techniques. See S. Tsuzuku, et al., "Blanket Tungsten Film Formation by Photo Enhanced and Plasma Enhanced Chemical Vapor Deposition," Electrochemical Society Fall Meeting, *ECS* Vol. 86-2, p. 500, 1986. However, the reproducibility of this process in a commercial environment has not been demonstrated. Moreover, it is not apparent that this process will overcome the classic problems with formation of tungsten gate MOS VLSI devices, i.e., the poor adhesion of tungsten to insulating layers, channeling of implanted dopants through the tungsten gate, lack of oxidation resistance, and gate dielectric degradation.

Among other growth and deposition processes for the formation of VLSI devices, low pressure chemical vapor deposition (LPCVD) of tungsten has emerged as a viable technology for the formation of MOS gate electrodes, low resistivity contacts and contact barriers, multilevel interconnections, and reduction of source/drain parasitic resistance. See Kobayashi, et al., "Non-Selective Tungsten CVD Technology for Gate Electrodes and Interconnection," Proceedings Third Int'l. IEEE VLSI Multilevel Interconnection Conference, pp. 436-442, 1986. However, conventional hot wall LPCVD furnaces are not appropriate for reproducible high rate tungsten deposition and nonselective formation of tungsten on insulators. Present hot wall furnaces suffer from depositing of tungsten on the walls of the furnace, reducing the efficiency of the furnace and eventually requiring disassembly of the furnace for cleaning.

Tungsten gate electrode fabrication by known sputtering techniques requires very pure targets to minimize mobile ion contamination and special effort is needed to reduce sputtering-induced gate damage. Tungsten deposition has also been tried using conventional LPCVD furnaces, operating at temperatures below 400° C. The processes implemented have included silicon reduction of $WF_6$, which is a selective, self-limiting deposition process; hydrogen reduction of $WF_6$ which is a selective process; blanket deposition of tungsten in $WF_6+H_2+SiH_4$, which is accomplished with an injection of silane for the gate electrode formation; and, silicon or hydrogen reduction of $WCl_6$, resulting in non-selective deposition at high temperatures. None of these processes have proven to be capable of reliably defining tungsten gate electrodes in small geometry devices.

SUMMARY OF THE INVENTION

It is an objective of this invention to provide a novel cold wall, single wafer, rapid thermal/microwave remote plasma multiprocessing (RTMRPM) reactor for in situ growth and deposition of dielectrics, silicon, and metals including silicon nitride, oxide and oxynitrides, as well as epitaxy of silicon, germanium, silicon carbide and diamond. As a part of the design of this reactor, it is an objective to provide ambient and temperature with controlled short transient times.

A related objective is to provide a reactor efficient at low temperatures and with reduced processing times for VLSI processing in order to enhance the utility of the reactor in the production of high yield, low quantity, application specific integrated circuits.

Another objective herein is to provide for in situ multiprocessing of semiconductor wafers, to eliminate the contamination of wafers that results from carrying the wafer from furnace to furnace, thereby enhancing the circuit yield of the system.

Another objective is to provide an RTMRPM reactor that will enhance equipment versatility and allow for flexible computer aided manufacturing of custom VLSI circuitry.

It is a further objective herein to provide apparatus useful for carrying out a process of selective or non-selective tungsten deposition.

The single wafer lamp heated multiprocessing reactor of this invention provides a highly selective high rate non-plasma deposition of tungsten, or a non-selective deposition of tungsten by plasma excitation. It also offers the capability of LPCVD of tungsten compounds, as well as the possibility of photonic excitation of ambient species.

The objectives herein are achieved by providing a novel cold wall single wafer rapid thermal/microwave remote plasma multiprocessing reactor comprising a vacuum chamber having means for mounting a wafer in the chamber, means for providing optical flux mounted adjacent one wall facing the back side of the wafer for optical heating of the wafer, and ports for plasma injection such that remote plasma can be generated and guided into the chamber. Ports are provided for gas injection both through the plasma generating chamber and for non-plasma injection. The plasma and non-plasma ports are connected through separate manifolds to a plurality of gas sources. The comprehensive reactor design is such that several wafer processing steps can be done sequentially in situ, while providing for optimization of each processing step.

Preferably, the vacuum chamber is a water cooled stainless steel chamber having a window in one wall, with an array of lamps facing the back side of the wafer through the window for heating the wafer. Multiple plasma injection ports are provided, arranged radially around a circle concentric with the mounted wafer to provide an even flow of plasma to the surface of the wafer. The center of the area defined by the plasma injection ports includes a sapphire window for process monitoring and for ultraviolet or laser enhancement of the process.

BRIEF DESCRIPTION OF THE DRAWINGS

The features and advantages of this invention will be more clearly understood by referring to the following description which is given with reference to these figures.

DETAILED DESCRIPTION OF A PREFERRED EMBODIMENT

Figure 1:
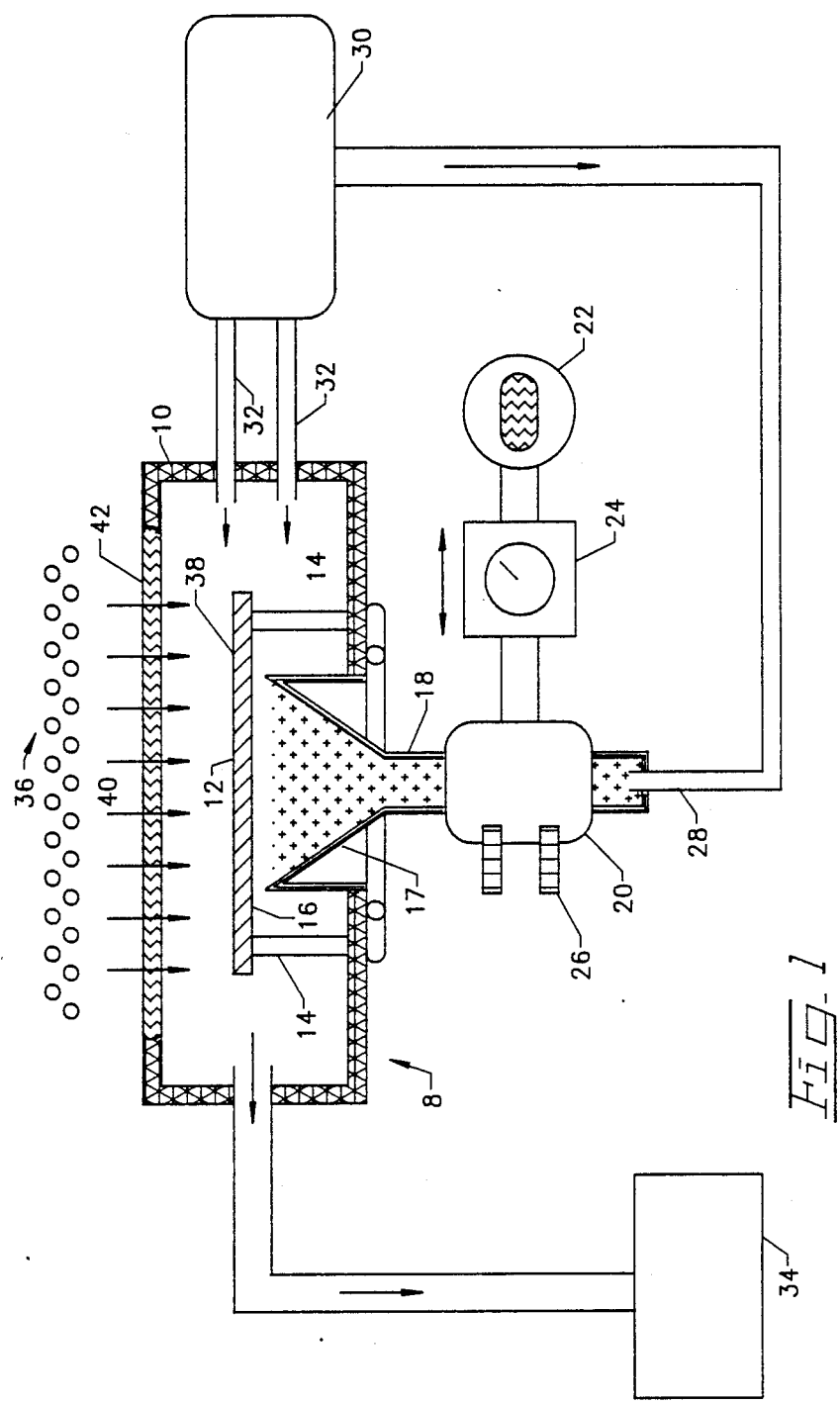
FIG. 1 is a schematic of the novel cold wall single wafer lamp heated rapid thermal/microwave remote plasma multiprocessing reactor.

Referring to the figures which show in schematic form the reactor 8 of this invention, FIG. 1 is a schematic of the reactor and its accompanying equipment. The reactor 8 comprises a vacuum chamber 10, preferably water cooled in accordance with known technology. Inside the chamber 10, a silicon wafer 12 sits on a plurality of low thermal mass quartz pins 14. A processed side 16 of the wafer 12 is shown facing the end cone 17 of a quartz discharge tube 18 which conveys plasma from a remote microwave plasma generating cavity 20 to the vacuum chamber 10.

Figure 2:
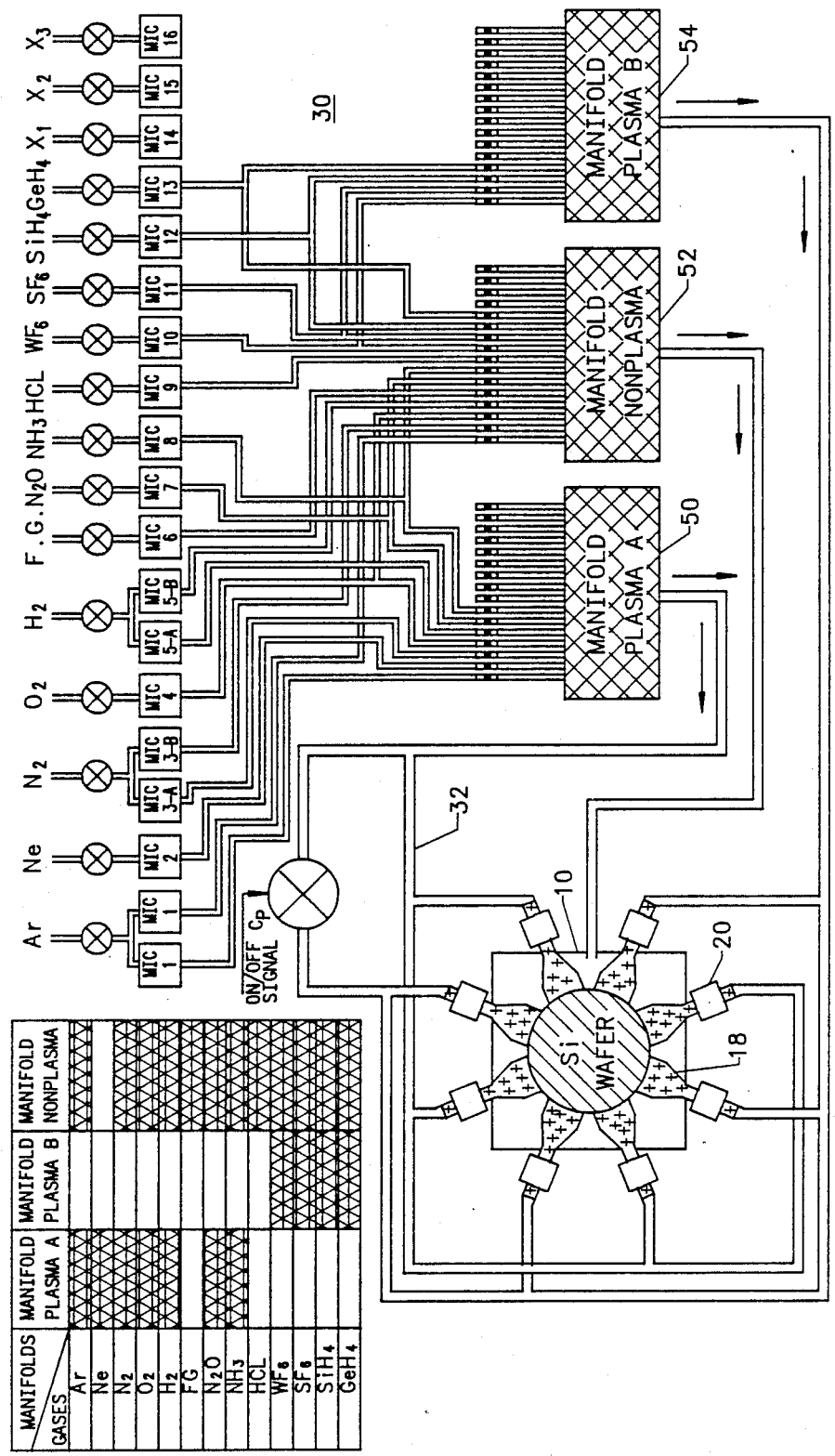
FIGS. 2A and 2B is a schematic of the gas distribution system for the multiprocessing reactor showing the exemplary gas sources, manifolds connecting the gas sources to the plasma and non-plasma injection ports, and the multiport array which is provided in the preferred embodiment of the invention, together with a connection chart (FIG. 2B) showing which gases are available through the respective manifolds to plasma and non-plasma ports.

As shown in greater detail in FIG. 2, the preferred embodiment of the vacuum chamber 10 includes a plurality of radially spaced discharge tubes 18. The remote microwave plasma generator cavity 20, designed in accordance with the incorporated '943 application, is driven by a microwave generator 22 and controlled using a tuner and power meter 24. Tuning pins 26 are provided to control the generation of plasma in the cavity 20, which then flows through the quartz discharge tube 18 into the chamber 10. A gas injector line 28 provides a coupling from the microwave cavity 20 and the plasma injector tube 18 to a manifold and a plurality of gas sources comprising a gas distribution system 30 shown in greater detail in FIG. 2. The same gas sources provide gas to flow through a separate manifold, also shown in FIG. 2, into the vacuum chamber 10 through non-plasma gas injector port 32. At least one of these ports must be provided; a plurality of non-plasma gas injector ports 32 may be provided to ensure even gas distribution throughout the vacuum chamber. The vacuum in the chamber is maintained using a pumping system 34 designed in accordance with known technology.

Heating of the wafer 12 is accomplished by providing a plurality of tungsten-halogen lamps 36 mounted adjacent one wall of the vacuum chamber facing the rear surface 38 of the wafer 12. In a preferred embodiment, the lamps 36 are arrayed in a crosswise, overlapping fashion to insure an even distribution of the optical heating flux 40 which is shown reaching the rear surface 38 of the wafer through a water cooled quartz window 42. By following these design principles, the wafer 12 temperature can be controlled over a range from room temperature to 1150° C. for periods ranging from several seconds up to many minutes. By providing the remote microwave plasma generation, a gas distribution system 30 available through plasma and/or non-plasma ports, as shown in the preferred embodiment, the external heating source 36 conveying optical heating flux through a water cooled quartz window 42, multiple processes may be performed on a single wafer without handling the wafer or removing the wafer from one reactor to another, thereby maximizing the possibility of sequential, in situ processing. The reactor as designed enhances equipment versatility, improves process reproducibility and uniformity, increases growth and deposition rates of layers defined by the processes provided by this invention, and thereby effectively achieves in situ semiconductor multiprocessing.

The remote plasma is generated for conveyance to the vacuum chamber 10 through quartz discharge tube 18 by a microwave discharge cavity 20 operating at 2450 MHz (S band) in the preferred embodiment. In contrast to the conventional localized plasma techniques used in conventional semiconductor wafer processing, the use of this remote microwave plasma approach allows selective and controlled generation of specific plasma species simultaneously with injection of additional non-plasma gases into the process chamber without having to deal with the complications arising from the gas discharge in a composite gas ambient. The availability of remote plasma processing together with remote optical heating, the optical flux being conveyed through a water cooled window in the water cooled vacuum chamber allows low temperature dielectric growth and CVD of insulators and semiconductors. It has also allowed the development of several new processes for non-selective deposition of tungsten and its compounds (e.g., nitrides) on insulating layers for MOS gate applications. This system configuration is very flexible for in situ multiprocessing because it allows rapid cycling of ambient gases, temperature and plasma with negligible cross-contamination and process memory effects. As a result, the reactor optimizes the process designers' ability to use computer aided manufacturing (CAM) for custom VLSI circuits.

A further important feature hereof that leads to its flexibility in the process design is the gas distribution network 30 shown in detail in FIG. 2. As shown in FIG. 2, the distribution network includes three manifolds 50, 52, 54 that are connected to a plurality of gas sources in a manner schematically shown in the correction chart at the upper left of the figure. The connection chart in which the gases are shown on the vertical axis and the manifolds on the horizontal axis can be interpreted by the convention that black at an intersection indicates the existence of a connection through the indicated manifold, while white at the intersection indicates that no connection is available. The gases made available through the manifolds are clearly displayed on the top of FIG. 2, although in addition to the ones shown, available gases may include $NF_3$, heated $WCl_6$ solid source, $SiF_4$ and others indicated to be available by the letters X1, X2 and X3. FIG. 2 also more clearly shows the fact that in the preferred embodiment, eight discharge tubes 18, each of the same general design as that shown in FIG. 1, are connected to the vacuum chamber 10. The tubes 18 are provided in a radially regular array around the region where the silicon wafer is to be mounted, with the tubes preferably angled toward the wafer to provide an even distribution of plasma over the surface of the wafer. Microwave cavities 20 are provided at the entrance to each of the discharge tubes 18.

In a preferred embodiment, a sapphire window is provided in the central region left vacant by the regular radial spacing of the ports of the discharge tubes, this sapphire window being directly below the process top surface 16 of the wafer. An ultraviolet or laser source may be provided outside the vacuum chamber facing this window for photon enhancing processing of the wafer. Also, continuous process monitoring may be achieved through this sapphire window that faces the processed surface of the wafer. The FIG. 2 schematic also shows a single non-plasma gas injector 32, although more than one injector may be provided to achieve even gas distribution throughout the vacuum chamber.

It has been found that the reactor lends itself to several applications including the formation of thin dielectrics on silicon (plasma or non-plasma) comprising oxides (formed by rapid thermal oxidation, RTO) and nitrides (formed by rapid thermal nitridation, RTN), nitroxides (RTO/RTN) and oxynitrides (RTN/RTO) as well as formation of application specific dielectrics (e.g., RTO/ rapid thermal annealing, RTA/RTN). The process is also useful for the formation of dielectrics on germanium and galium arsenide, using plasma RTN for Ge/CMOS with germanium nitride, and plasma RTN for GaAs (surface pacification and MISFETs. The reactor is also highly useful for LPCVD of dielectrics and semiconductor epitaxy, including LPCVD of silicon nitride, oxide, and oxynitrides and epitaxy Si, Ge, and diamond.

A major use of the reactor herein is to be the formation of tungsten gates and interconnections, especially the plasma non-selective deposition of gates, the non-plasma selective deposition of contacts and interconnections, $NC_2$ tungsten gate MOS processing and gate engineering, and plasma and non-plasma LPCVD of tungsten nitrides. As used in this application, "selective" means that the deposition of the tungsten occurs only on silicon or metal, while non-selective deposition refers to blanket deposition over the surface being worked by the tungsten.

More specifically, a critical focus of the process development effort for this reactor was to develop reliable processes for in situ fabrication of tungsten gate MOS devices. In the multiprocessing environment of this invention, this required the growth of gate dielectric by RTO and RTN cycles, followed by a non-selective tungsten deposition process to form the electrode.

A variety of selective and non-selective processes for tungsten deposition were investigated in this work. Table 1 presents a summary of the tungsten deposition processes developed using the disclosed multiprocessing reactor. These techniques are grouped based on the plasma condition and the injection mode of various ambient gases. The depositions were studied extensively in a wide range of gas flows, pressure, and substrate temperature.

When $WF_6$ or a mixture of $WF_6+H_2$ was injected through the non-plasma port, generation of $H_2$ plasma, Ar plasma, or $Ar+H_2$ plasma in the quartz tube promoted non-selective tungsten deposition on insulating surfaces. Addition of Ar to $H_2$ enhances the plasma emission intensity and density of available atomic hydrogen, a critical facet in several processes in making it non selective. Another non-selective deposition technique developed in this work employed $WF_6+Ar$ plasma along with non-plasma $H_2$. Under appropriate experimental conditions none of these non-selective deposition techniques caused tungsten deposition on the chamber walls or inside the quartz tube. It should be noted that the chamber can be cleaned using plasma techniques without dismantling.

The mixture of $NH_3+H_2$ and $WF_6$ always resulted in non-selective deposition for both plasma and non-plasma types of processes. Moreover, the combination of $N_2+H_2$ plasma and $WF_6$ also resulted in non-selective metallic film deposition. The films deposited by any of the last three techniques in Table 1 (rows J, K, L) had higher resistivities compared to pure tungsten and were expected to be tungsten nitride compounds. The surface morphology and stability of the CVD tungsten nitrides were functions of the deposition technique and experimental conditions. Tungsten nitride may exhibit useful properties such as oxidation resistance, diffusion barrier, and ion implant channeling stop. Tungsten nitride films could also be formed by RTN of tungsten layers. The tungsten films nitrided at the highest temperature (1000° C. or more) were powdery; however, the films nitrided at lower temperatures (e.g., 825° C.) were stable. According to the Auger depth profiles the films nitrided at 825° C. and above were tungsten oxynitrides. Good adhesion non-selectively deposited tungsten film to insulators was obtained for tungsten films even thicker than 1 μm. In some instances, one initial tungsten deposition cycle was followed by another type of deposition in order to obtain optimal adhesion and uniformity properties.

Any combination of $WF_6/H_2/Ar$ without plasma discharge (rows A through E in Table 1) resulted in very selective tungsten depositions only on exposed silicon areas. The selective depositions were performed in a wide range of gas flow rates, pressure, and temperature and selectivity was maintained for depositions tungsten deposition thickness well over 1 μm. Compared to a furnace, the single-wafer cold-wall reactor offers a much larger processing window for selective processes without loss of selectivity after long times at elevated temperatures as much as 450° C. $SiF_4$ is known to retard the silicon reduction reaction of $WF_6$. Selectivity was also preserved in a mixture of $WF_6/H_2/SiF_4$ even at temperatures as high as 650° C. This indicated that in contrast to $SiH_4$ (injected in prior art process work to stop selectivity), $SiF_4$ cannot initiate non-selective tungsten deposition even at very high deposition temperatures. The mixture of $H_2$ and $SiF_4$ did not result in any silicon deposition at temperatures as high as 650° C.

Figure 3:
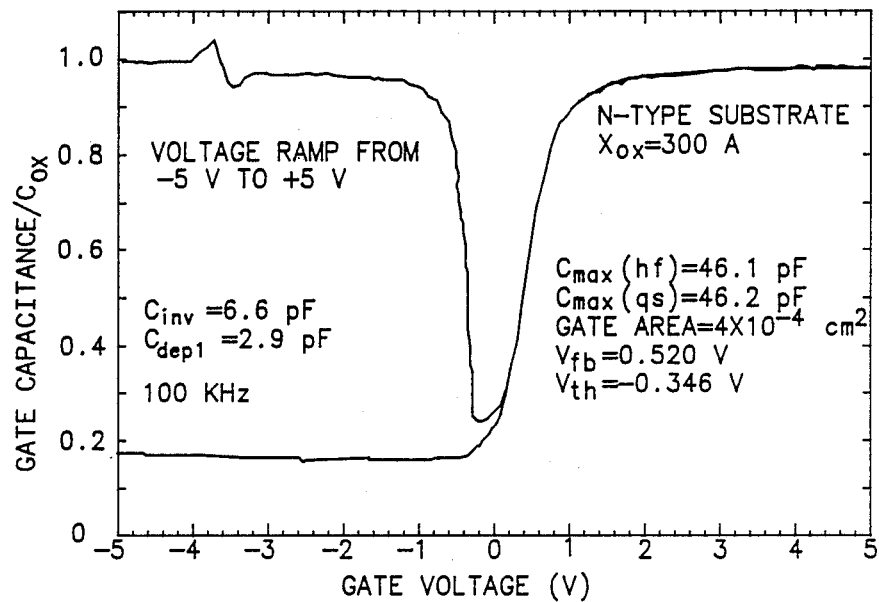
FIG. 3 is a graph of the capacitance voltage characteristics of MOS devices fabricated using the reactor of this invention.
Figure 4:
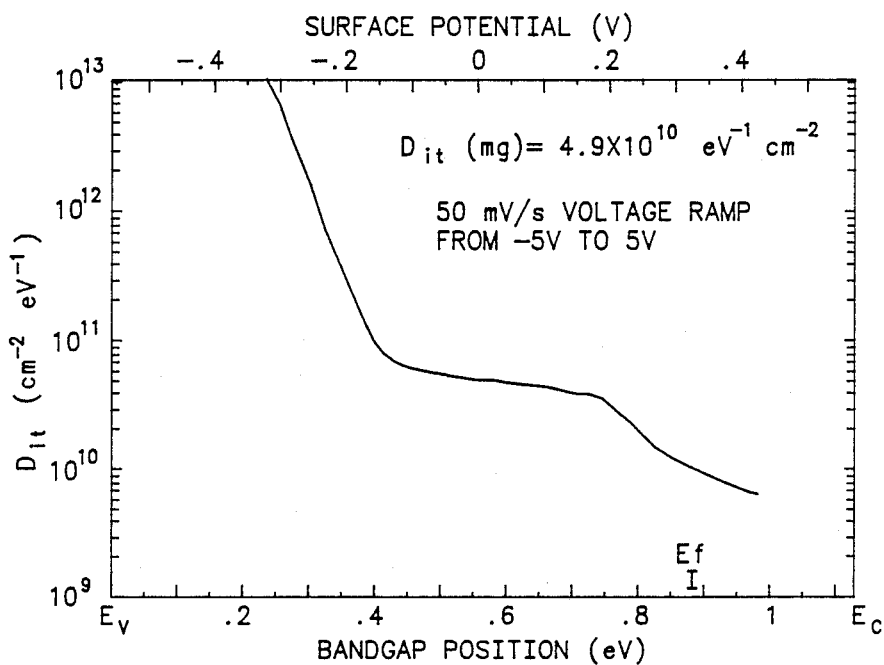
FIG. 4 is a graph of the surface state density distribution of tungsten gate devices fabricated using this invention; and Table 1 lists various types of plasma and non-plasma tungsten LPCVD processes which were so far developed in the reactor of this invention.

All of the non-selective deposition techniques developed in this work are applicable to in situ fabrication of metal gate MOS devices. Various MOS devices were successfully fabricated using these techniques. As an example, FIG. 3 plots the high and low frequency capacitance-voltage (C-V) characteristics of MOS devices of an MOS device with RTMRPM-deposited tungsten gate and without any final forming gas anneal. Nearly 300 Å thick gate oxide was grown in a furnace in dry oxygen ambient at 950° C. for 60 min Ar anneal at the same temperature. In these particular devices, the initial tungsten nucleation on gate oxide was promoted by a plasma deposition process (row G in Table 1) and this cycle was followed by a non-plasma deposition cycle (row E in Table 1) to make the film thicker. As indicated by the C-V characteristics, the devices exhibit respectable performance and negligible plasma damage. The oxide thickness measured by ellipsometry (308 Å) and extracted from the C-V data (303 Å) were similar which implies that no reduction of $SiO_2$ occurred during the initial plasma deposition cycle. Assuming negligible fixed oxide charge density, the flatband voltage value (0.54 V) indicates that the gate work function is located near the silicon midgap which is what should be expected from tungsten and should be ideal for NMOS as well as PMOS devices. The surface-state density distribution plotted in FIG. 4 shows a midgap value of $6 \times 10^{10}$ $eV^{-1}cm^{-2}$. This value is relatively low for an unannealed MOS device. There may have been a possibility of some hydrogen annealing during the tungsten deposition process.

In summary, this novel rapid thermal/remote microwave plasma multiprocessing technique has clear merits for in situ fabrication of future high-performance MOS VLSI circuits.

Alternatives to the reactor and the specific process disclosed herein may become apparent to a person of skill in this technology. Therefore, the scope of the invention is to be limited only by the following claims.

What is claimed is:

1. A rapid thermal plasma multiprocessing reactor for in-situ growth and deposition of layers on a wafer comprising
   a vacuum chamber including top, bottom and side walls,
   means for supporting said wafer with a top surface of said wafer to be processed facing the bottom of said chamber,
   at least one quartz discharge tube mounted in said bottom of said reactor facing said wafer top surface for conveying plasma gas from a remote plasma generating chamber located outside of said vacuum chamber to said vacuum chamber,
   heating means mounted facing said wafer mount for heating said back side of said wafer, and
   at least one non-plasma injector port connected through a non-plasma manifold to a plurality of gas sources for selectively conveying gas to said chamber whereby a plurality of processes affecting said wafer may be carried out without removing said wafer from said chamber.

2. A reactor as in claim 1 including a remote plasma generating microwave cavity having an output coupled to said vacuum chamber through said quartz tube, the input to said microwave cavity being coupled through a gas distribution manifold to a plurality of gas sources for growth and deposition of layers on said wafer.

3. A reactor as in claim 1 wherein said heating means comprise an array of lamps positioned outside said vacuum chamber and facing said wafer through a window in said top surface of said chamber to heat said wafer.

4. A reactor as in claim 3 wherein said lamps are tungsten-halogen lamps, said window comprising a quartz window for passing the optical flux to said wafer.

5. A reactor as in claim 1 comprising a plurality of said quartz discharged tubes arranged in a regularly radially spaced array facing said wafer top surface for conveying plasma gas evenly to said wafer surface.

6. A reactor as in claim 5 wherein said discharge tubes surround a sapphire window mounted in the bottom of said reactor whereby photon enhanced processing using laser or ultraviolet is achieved.

7. A reactor as in claim 1 including a gas distribution network comprising said plurality of gas sources selectively connected through a non-plasma manifold to said non-plasma injector port and through a plasma injector to said quartz discharge tube to selectively convey said gases to said vacuum chamber.

8. A reactor as in claim 1 including a plurality of quartz discharge tubes each having an exhaust end emptying into said chamber, the exhaust ends being arranged in a circle concentric with the center of said wafer to convey plasma in an even flow to the surface of said wafer, the non-exhaust end of each said discharge tube being connected to a plasma generating microwave chamber for creating plasma to be conveyed to said chamber.

9. A reactor as in claim 8 wherein said tubes are regularly radially spaced around said circle and mounted at an angle toward the center of said circle for conveying said plasma to said wafer.

10. In a rapid thermal plasma multiprocessing reactor for in situ growth and deposition of layers on a wafer comprising a vacuum chamber including top, bottom and side walls, means for supporting said wafer with a top surface of said wafer to be processed facing the bottom of said chamber, at least one quartz discharge tube mounted in said bottom of said reactor facing said wafer top surface for conveying plasma gas from a remote plasma generating chamber located outside of said vacuum chamber to said vacuum chamber, means mounted adjacent to the top surface of said chamber facing said wafer mount for heating said back side of said wafer, and at least one non-plasma injector port connected through a non-plasma manifold to a plurality of gas sources for selectively conveying gas to said chamber whereby a plurality of processes affecting said wafer may be carried out without removing said wafer from said chamber, a method of fabricating tungsten-gate MOS devices comprising the steps of in situ growth of a gate dielectric by rapid thermal oxidation and rapid thermal nitridation cycles followed by a non-selective tungsten deposition process to form the gate electrode.

11. A method as in claim 10 wherein the tungsten deposition step comprises the steps of injecting $WF_6$, or $WF_6+H_2$ through said non-plasma port, and injecting $H_2$ plasma, Ar plasma or $Ar+H_2$ plasma through said plasma port to non-selectively deposit tungsten on insulating surfaces.

12. In a rapid thermal plasma multiprocessing reactor for in-situ growth and deposition of layers on a wafer comprising a vacuum chamber including top, bottom and side walls, means for supporting said wafer with a top surface of said wafer to be processed facing the bottom of said chamber, at least one quartz discharge tube mounted in said bottom of said reactor facing said wafer top surface for conveying plasma gas from a remote plasma generating chamber located outside of said vacuum chamber to said vacuum chamber, heating means mounted facing said wafer mount for heating said back side of said wafer, and at least one non-plasma injector port connected through a non-plasma manifold to a plurality of gas sources for selectively conveying gas to said chamber whereby a plurality of processes affecting said wafer may be carried out without removing said wafer from said chamber, a method of selectively depositing tungsten on exposed silicon areas of said wafer comprising flowing any combination of $WF/H_2/Ar$ without plasma discharge into said vacuum chamber at temperatures up to 450° C.

13. Apparatus as claimed in claim 3 wherein said wafer rests on low thermal mass quartz pins.

14. Apparatus as claimed in claim 12 wherein said wafer rests on low thermal mass quartz pins.

* * * * *